United States Patent
Mehrotra et al.

(10) Patent No.: US 12,501,632 B2
(45) Date of Patent: Dec. 16, 2025

(54) SEMICONDUCTOR DEVICE WITH IMPROVED MECHANICAL STRESS RESISTANCE

(71) Applicant: NXP B.V., Eindhoven (NL)

(72) Inventors: Saumitra Raj Mehrotra, Scottsdale, AZ (US); Xu Cheng, Chandler, AZ (US)

(73) Assignee: NXP B.V., Eindhoven (NL)

( * ) Notice: Subject to any disclaimer, the term of this patent is extended or adjusted under 35 U.S.C. 154(b) by 211 days.

(21) Appl. No.: 18/082,541

(22) Filed: Dec. 15, 2022

(65) Prior Publication Data
US 2024/0204113 A1    Jun. 20, 2024

(51) Int. Cl.
*H10D 8/25* (2025.01)
*H10D 8/01* (2025.01)

(52) U.S. Cl.
CPC ............... *H10D 8/25* (2025.01); *H10D 8/022* (2025.01)

(58) Field of Classification Search
CPC ............... H01L 29/866; H01L 29/6609; H01L 29/66098; H01L 29/66106; H01L 29/66356; H01L 29/66128; H01L 29/404; H01L 29/402; H01L 23/562; H01L 21/28035; H01L 21/0245; H01L 21/02381; H01L 21/02123; H01L 21/02516; H01L 21/02532; H01L 29/408; H01L 29/0626; H01L 29/861; H01L 29/66113; H01L 27/0266; H01L 27/0255; H01L 27/0636; H01L 27/0286; H01L 27/0207;
(Continued)

(56) References Cited

U.S. PATENT DOCUMENTS

| 4,590,664 A | * | 5/1986 | Prentice | H01L 29/402 |
| | | | | 438/983 |
| 5,223,737 A | * | 6/1993 | Canclini | H01L 27/0248 |
| | | | | 257/362 |

(Continued)

FOREIGN PATENT DOCUMENTS

JP    2012174894 A    9/2012

OTHER PUBLICATIONS

Tabata et al., Control of internal stress and Young's modulus of SbN4 and polycrystalline silicon thin films using the ion implantation technique, 1990, Appl. Phys. Lett 56 (14), Apr. 2, 1990, pp. 1314-1316. (Year: 1990).*

(Continued)

*Primary Examiner* — Natalia A Gondarenko (57) ABSTRACT

Provided is a semiconductor device that includes: a semiconductor substrate having a first doped region of a first doping type and a second doped region of a second doping type, the first doped region being beneath but immediately adjacent to, the second doped region, with the first doping type being opposite the second doping type, thereby forming a junction region between the first doped region and the second doped region; and an additional layer that has been deposited above the junction region having similar mechanical properties as the semiconductor substrate. The additional layer covers at least 50% of a projection area of the junction region. The second doped region has a top surface, the additional layer has a bottom surface, and at least 90% of the bottom surface of the additional layer is electrically insulated from the top surface of the second doped region.

14 Claims, 6 Drawing Sheets

(58) Field of Classification Search
CPC ............. H01L 27/0288; H01L 27/0292; H01L 27/1203; H10D 8/20; H10D 8/25; H10D 8/021; H10D 8/022; H10D 8/024; H10D 8/043; H10D 8/045; H10D 8/411; H10D 62/105; H10D 62/109; H10D 62/112; H10D 62/117; H10D 62/123; H10D 62/124; H10D 62/125; H10D 62/128; H10D 62/129; H10D 64/111; H10D 64/112; H10D 64/20; H10D 64/23; H10D 64/254; H10D 64/256; H10D 64/512; H10D 64/513
USPC ....... 257/106, 175, 199, 481, 551, 546, 362, 257/363, 603, 605
See application file for complete search history.

(56) References Cited

U.S. PATENT DOCUMENTS

| | | | | |
|---|---|---|---|---|
| 5,376,818 | A * | 12/1994 | Kurtz | ............... H10D 48/50 257/E29.082 |
| 5,643,820 | A * | 7/1997 | Williams | ............ H01L 29/7809 438/983 |
| 8,043,943 | B2 * | 10/2011 | Maboudian | ....... H01L 21/02532 257/E21.135 |
| 8,198,703 | B2 | 6/2012 | Lin et al. | |
| 9,966,429 | B2 | 5/2018 | Chen et al. | |
| 2001/0013611 | A1 | 8/2001 | Minami et al. | |
| 2005/0195050 | A1 * | 9/2005 | Lutz | ................... H03H 9/02401 333/197 |
| 2009/0039424 | A1 * | 2/2009 | Su | ........................ H10D 64/112 257/E29.256 |
| 2013/0175529 | A1 * | 7/2013 | Mauder | ................... H10D 64/62 257/51 |
| 2016/0315189 | A1 * | 10/2016 | Song | ................. H01L 29/42356 |
| 2017/0194488 | A1 * | 7/2017 | Gao | ..................... H10D 64/112 |
| 2022/0262742 | A1 * | 8/2022 | Hou | ..................... H01L 23/3128 |

OTHER PUBLICATIONS

Miller, Perry et al. "Precision voltage references", Texas Instruments Incorporated; Data Acquisition, Analog Applications Journal, Nov. 1999, 5 pgs.

Liew, Madelyn et al. "Integrated Zener Diodes for Smart Power IC"; 2019 IEEE 9th International Nanoelectronics Conferences; Jul. 3, 2019; 5 pages.

Yabu, Toshiki et al. "Improvement of Asymmetrical Characteristics in Submicron CMOS Devices", Electronics & Communications in Japan, Part II -Electronics; vol. 73, No. 3; Mar. 1990 ; 7 pages.

* cited by examiner

SEMICONDUCTOR DEVICE WITH IMPROVED MECHANICAL STRESS RESISTANCE

FIELD OF THE INVENTION

The present invention pertains to improved semiconductor-device structures, as well as processes for fabricating them, and has particular advantages with respect to Zener diodes and other semiconductor devices that are intended to be operated in a manner similar to that of a Zener diode.

BACKGROUND

The following discussion concerns certain background information related to the present invention. However, it should be understood that only knowledge clearly, explicitly and specifically described herein as being "conventional" or "prior art" is intended to be characterized as such. Everything else should be understood as knowledge and/or insight originating from the present inventors.

Precision analog circuitry often requires accurate voltage-reference circuits. The circuits most commonly used for this purpose employ a Zener diode (or another semiconductor device operating in a similar manner) as the critical component. Generally speaking, a Zener diode is one that is intended to be operated in reverse mode, having been optimized so as to have a constant or nearly constant breakdown voltage for that purpose, e.g., by relying on simultaneous tunneling and avalanche breakdown. As discussed in greater detail below, the present inventors have discovered ways in which conventional Zener diodes and other semiconductor devices can be improved.

SUMMARY OF THE INVENTION

One embodiment of the invention is directed to a semiconductor device that includes: a semiconductor substrate having a first doped region of a first doping type and a second doped region of a second doping type, the first doped region being beneath but immediately adjacent to, the second doped region, with the first doping type being opposite the second doping type, thereby forming a junction region between the first doped region and the second doped region; and an additional layer that has been deposited above the junction region, the additional layer having similar mechanical properties as the semiconductor substrate. The additional layer covers at least 50% of a projection area of the junction region, the projection area being the entire portion of the top surface of the semiconductor substrate that is immediately above the junction region. The second doped region has a top surface, the additional layer has a bottom surface, and at least 90% of the bottom surface of the additional layer is electrically insulated from the top surface of the second doped region.

Another embodiment is directed to a method of fabricating a semiconductor device, in which a semiconductor substrate is doped to produce a first doped region of a first doping type; the semiconductor substrate is doped to convert an upper portion of the first doped region to a second doped region of a second doping type, the second doping type being opposite the first doping type, thereby forming a junction region between the first doped region and the second doped region; an oxide layer is formed on an upper surface of the semiconductor substrate; and an additional layer is deposited on top of the oxide layer such that (a) the additional layer covers at least 50% of a projection area of the junction region, the projection area being the entire portion of the top surface of the semiconductor substrate that is immediately above the junction region, and (b) at least 90% of the bottom surface of the additional layer is in contact with the oxide layer.

Certain more-specific implementations of either of the foregoing embodiment(s) include one or any combination of the following features.

The semiconductor substrate is substantially entirely comprised of a first material, the additional layer is substantially entirely comprised of a second material, the first material has a first Young's modulus, and the second material has a second Young's modulus that is within 10% of the first Young's modulus.

The semiconductor substrate is substantially entirely comprised of a first material and the additional layer is substantially entirely comprised of a second material, and the first material and the second material are at least 90% identical.

The first material and the second material are at least 95% identical.

The first material and the second material are at least 98% identical.

Each of the first material and the second material is comprised of at least 98% silicon.

The additional layer covers at least 80% of the projection area of the junction region.

The additional layer covers at least 95% of the projection area of the junction region.

The entire bottom surface of the additional layer is electrically insulated from the top surface of the second doped region.

The semiconductor substrate has a top surface into which an oxide layer has been formed, and the oxide layer is disposed between the bottom surface of the additional layer and the top surface of the second doped region.

A second additional layer is (or has been) deposited above the additional layer, the second additional layer also having similar mechanical properties as the semiconductor substrate and covering at least 50% of a projection area of the junction region.

The bottom surface of the second additional layer is substantially entirely electrically insulated from the top surface of the additional layer.

The additional layer is at least 0.1 micron thick.

Both the first doped region and the second doped region are heavily doped.

The first doping type is N-type, and the second doping type is P-type.

An electrical contact to the second doped region and an electrical conductor extending between the electrical contact and the additional layer are provided.

The first doped region and the second doped region are parts of a Zener diode.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the accompanying drawings. However, it should be understood that the drawings merely depict certain representative and/or exemplary embodiments and features of the present invention and are not intended to limit the scope of the invention in any manner. The following is a brief description of each of the accompanying drawings.

DESCRIPTION OF THE PREFERRED EMBODIMENT(S)

For ease of reference, the present disclosure is divided into sections. The general subject matter of each section is indicated by that section's heading. However, such headings are included simply for the purpose of facilitating readability and are not intended to limit the scope of the invention in any manner whatsoever.

An integrated circuit (IC) chip undergoes multiple thermal cycles during qualification that lead to development of mechanical stress inside the package. This stress buildup, particularly along the diode's junction, e.g., can impact a Zener breakdown voltage and thereby affect the accuracy of any analog circuitry into which the Zener diode subsequently is incorporated. Similar stresses can occur during ordinary use when electronics are subject to large temperature variations, e.g., meaning that significant breakdown voltage drift can occur over time. Accordingly, the present inventors have discovered the need for a Zener diode design that minimizes the effects of mechanical stress on the diode's electrical characteristics, without adding significantly to the cost of manufacture.

Embodiment with Single Additional Layer.

FIGS. 1-6 conceptually illustrate the fabrication of a Zener diode, as well as the resulting final structure, according to a representative embodiment of the present invention. Initially, in FIG. 1, beginning with a lightly doped P-type semiconductor substrate 10, a deep, heavily doped central N-type region 12 and a lightly doped N-type region 14, which is wider (i.e., occupying a larger footprint) and shallower than region 12, are formed through appropriate doping processes. In the current embodiment, substrate 10 is made of silicon, heavily doped central N-type region 12 is formed by implanting phosphorus atoms at 500 kev (thousand electron volts), dose ranging between $1\text{-}10\times10^{15}$ atoms/cm$^2$ and 2,000 kev ranging between $1\text{-}10\times10^{13}$ atoms/cm$^2$.

Figure 1:
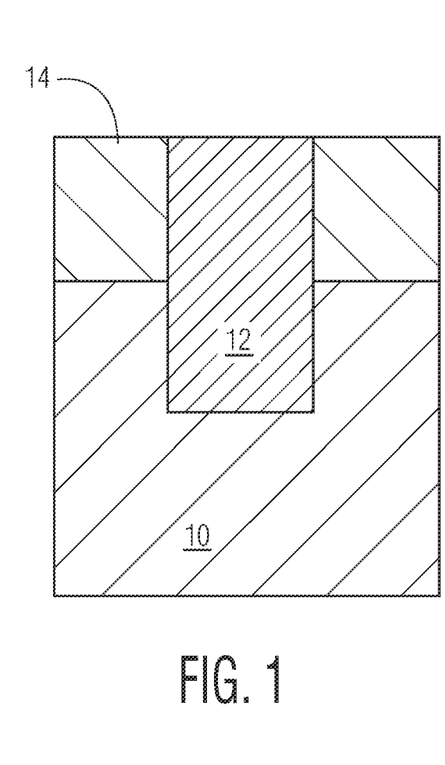
FIG. 1 is a conceptual diagram showing a semiconductor substrate after a deep, heavily doped central N-type region and a wider but shallower lightly doped N-type region have been formed.
Figure 2:
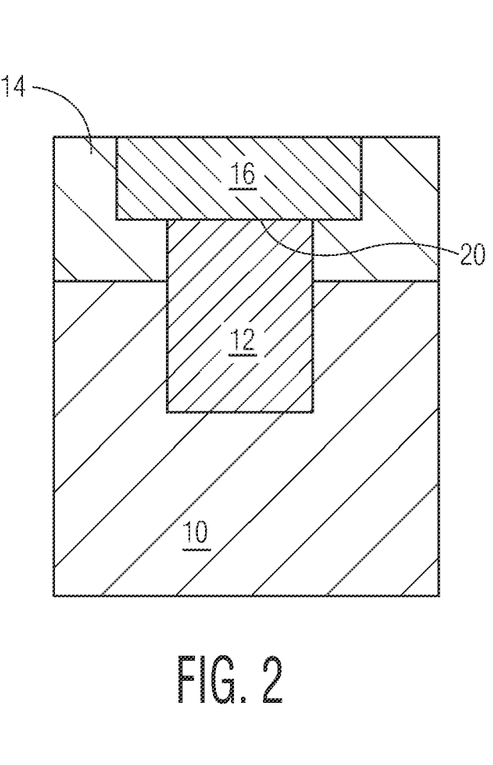
FIG. 2 is a conceptual diagram showing the structure of FIG. 1 after a heavily doped P-type region has been formed on top of the heavily doped central N-type region, thereby creating a junction.

Next, as shown in FIG. 2, a heavily doped P-type region 16 is formed on top of the heavily doped central N-type region 12. As shown, heavily doped P-type region 16 preferably is wider than heavily doped central N-type region 12, but not as wide or deep as lightly doped N-type region 14. In the current embodiment, the heavily doped P-type region 16 is formed by implanting boron atoms at 20 kev, ranging between $1\text{-}10\times*10^{15}$ atoms/cm$^2$.

As a result of the preceding steps, the heavily doped N-type region 12 has, e.g., a doping level of approximately $10^{18}\text{-}10^{19}$ atoms/cm$^3$, and the heavily doped P-type region 16 has, e.g., a doping level of approximately $10^{19}\text{-}10^{20}$ atoms/cm$^3$. Such steps also result in the formation of a junction 20 at the boundary between regions 12 and 14, e.g., at a depth ranging between 0.2-1.0 micron (µm).

Figure 3:
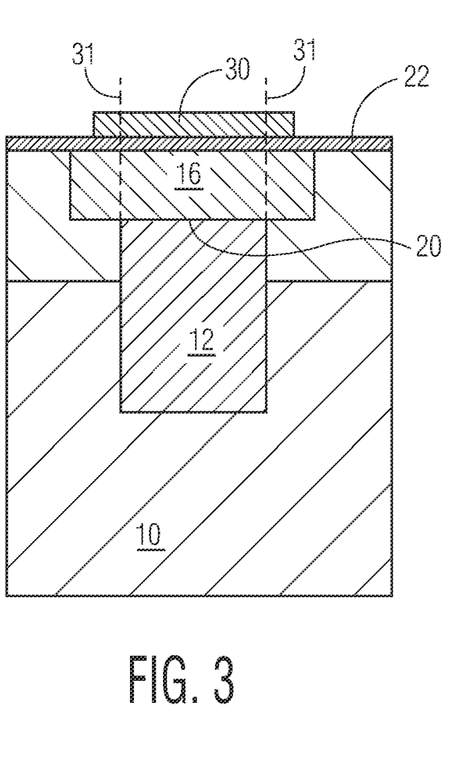
FIG. 3 is a conceptual diagram showing the structure of FIG. 2 after an oxide layer has been formed on the top surface of the semiconductor substrate and then an additional (e.g., polysilicon) layer has been deposited on top of it.

As shown in FIG. 3, an oxide layer 22 (high quality silicon-oxide in the current embodiment) is then grown, preferably across the entire relevant surface (e.g., the entire surface of that portion of the semiconductor die that eventually will be the subject device, which is a Zener diode in the present embodiment). In alternate embodiments, another insulating layer can be formed or deposited in place of oxide layer 22, and accordingly, references herein to an oxide layer can be replaced with references to an insulating layer. In any event, an additional layer 30 (made of polycrystalline silicon, or polysilicon, in the present embodiment) is then deposited (or otherwise formed) on top of the oxide layer 22. Preferably, additional layer 30 covers at least 50% (more preferably, at least 70%, 80%, 90%, 95% or 100%) of a projection area of the junction 20, with such projection area being the entire portion of the top surface of the semiconductor substrate 10 that is immediately above the junction 20 (e.g., bounded by imaginary vertical lines 31). At the same time, the heavily doped P-type region 16 preferably is wider than additional layer 30 by at least 1 µm in at least one (more preferably, each) lateral direction to allow for anode contact formation.

As noted above, in the current embodiment, the semiconductor substrate 10 is made of silicon, and the additional layer 30 is made of polysilicon. More generally, the materials used for semiconductor substrate 10 and additional layer 30 preferably have similar mechanical properties, e.g., particularly with respect to their Young's modulus (which preferably are within 20%, 10%, 5% or even 2% of each other). Preferably, both such materials respond identically, nearly identically or at least substantially the same (e.g., in terms of expansion and/or contraction) to changes in temperature (e.g., within 20%, 10%, 5% or even 2% of each other in this regard). For this purpose, the two materials are at least nearly identical to each other (e.g., at least 95%, 98% or 99% identical) in composition. For example, in the preferred embodiments, each of semiconductor substrate 10 and additional layer 30 is at least 99% silicon.

Also, in the current embodiment, additional layer 30 is at least 0.1 µm thick and more than covers the projection area of the junction 20 (e.g., by a margin of at least 20%). However, as noted above, smaller amounts of coverage are used in alternate embodiments, e.g., based on engineering, process, or cost trade-offs. In any event, it has been found that an additional layer 30 in accordance with the present invention often can reduce the amount of mechanical stress experienced by the junction 20.

Figure 4:
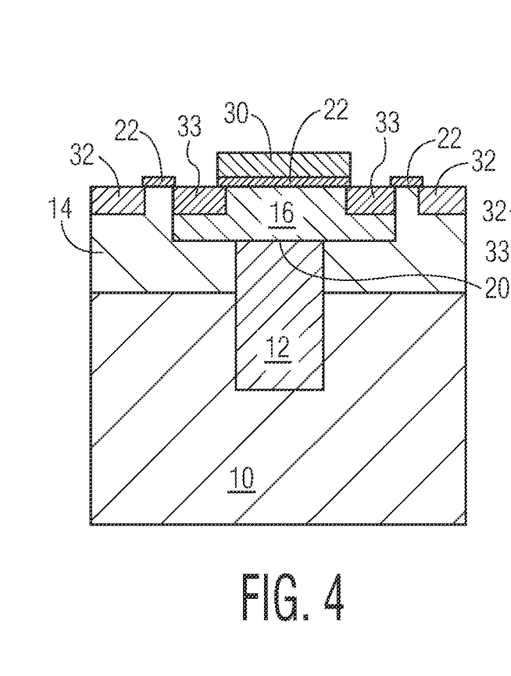
FIG. 4 is a conceptual diagram showing the structure of FIG. 3 after portions of the oxide layer have been etched away and the corresponding openings have been doped to provide anode and cathode regions.

Next, as shown in FIG. 4, portions of the oxide layer 22 are etched away, and the exposed areas of the semiconductor substrate 10 are further doped to create cathode regions 32 (in the lightly doped N-type region 14) and anode regions 33 (in the heavily doped P-type region 16). A typical doping level in each of cathode regions 32 and anode regions 33 is $10^{20}$-$10^{21}$ atoms/cm$^3$.

Figure 5:
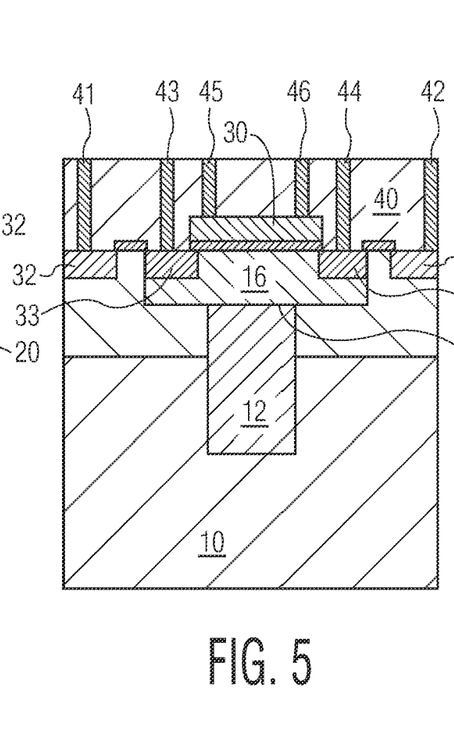
FIG. 5 is a conceptual diagram showing the structure of FIG. 4 after deposition of a first superstructure layer, etching of openings in such layer, and filling of such openings with metal to provide electrical contacts.
Figure 6:
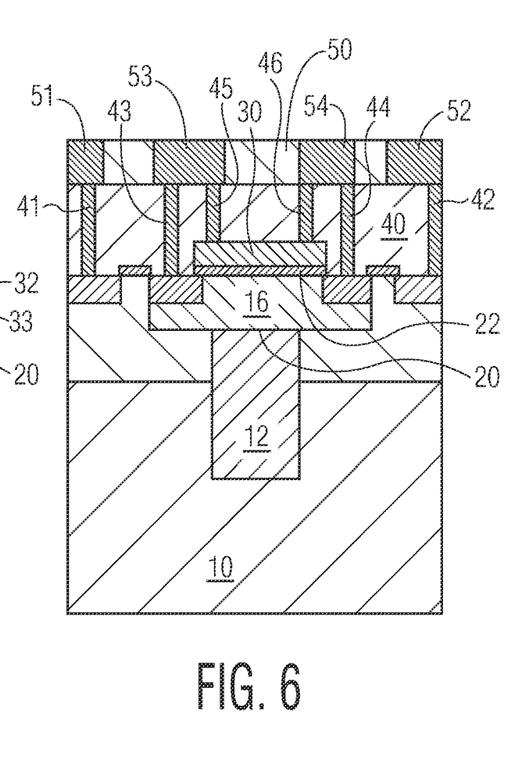
FIG. 6 is a conceptual diagram showing the structure of FIG. 5 after deposition of a second superstructure layer, etching of openings in such layer, and filling of such openings with metal to provide anode(s) and cathode(s) for connecting to the electronic device.

Finally, FIGS. 5 and 6 illustrate the application of a superstructure for establishing electrical connections to the resulting electronic device. In the current embodiment, the superstructure primarily is comprised of tetraethyl orthosilicate (TEOS), although other materials may be used in other embodiments. Initially, as shown in FIG. 5, a first layer 40 of TEOS is deposited. Openings are then etched into layer 40, and those openings are filled with metal (e.g., gold or copper), thereby forming electrical connections 41 and 42 to the cathode regions 32, electrical connections 43 and 44 to the anode regions 33 and electrical connections 45 and 46 to the additional layer 30. Thereafter, as shown in FIG. 6, a second layer 50 of TEOS is deposited, openings are etched into layer 50, and those openings are filled with metal so as to provide cathodes 51 and 52 from electrical connections 41 and 42, respectively, and anodes 53 and 54 from electrical connections 43 and 44, respectively. At the same time, anodes 53 and 54 also electrically connect to electrical connections 45 and 46, respectively.

As a result of this structure, direct electrically conductive (preferably metallic) connection(s) is/are established between heavily doped P-type region 16 (which is very close to the top surface of semiconductor substrate 10) and additional layer 30, thereby stabilizing electrical properties by equalizing voltage and ensuring that electrical field does not exist between the two components. This low electrical field helps maintain the integrity of the insulating layer 22. At the same time, the insulating layer between them (i.e., oxide layer 22 in the present embodiment) ensures no, or extremely low, current flow through the additional layer 30. This latter property is desirable, so in the preferred embodiments, the entire bottom surface of additional layer 30 is insulated from the upper surface of heavily doped P-type region 16. In any event, preferably at least 90% of the bottom surface of additional layer 30 is insulated from heavily doped P-type region 16 (i.e., the upper heavily doped region that forms the junction 20).

Embodiment with Multiple Additional Layers.

In the foregoing embodiment, an additional layer 30 is deposited on the semiconductor substrate 10 in order to protect junction 20 from mechanical stresses. Additional protection can be provided by depositing multiple such layers (i.e., two or more) in a stack. Fabrication of one such exemplary embodiment, in which one additional layer 60 is deposited (for a total of two) is now discussed.

Figure 7:
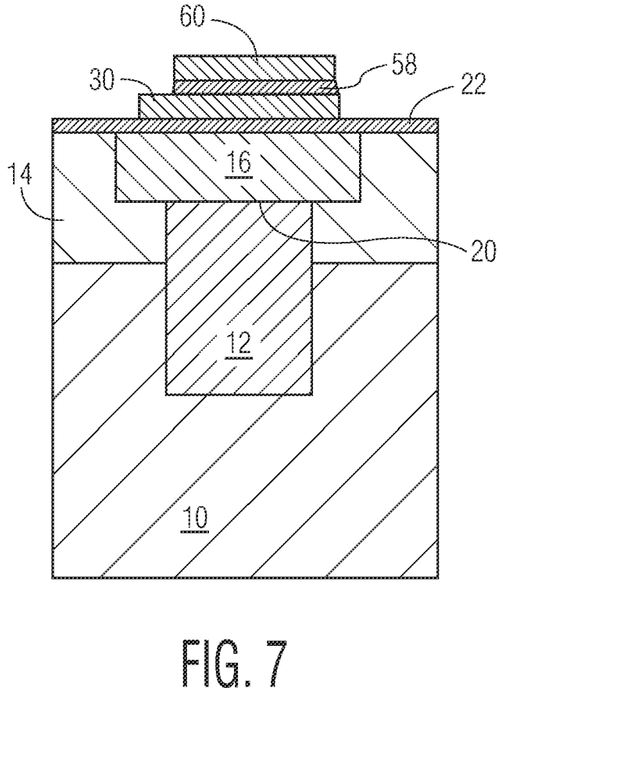
FIG. 7 is a conceptual diagram showing the structure of FIG. 3 after a second oxide layer has been formed on the top surface of the additional layer and then a second additional layer has been deposited on top of the second oxide layer.

The initial steps of the present fabrication process are the same as those discussed above in connection with FIGS. 1-3. Accordingly, the discussion of those steps is not repeated here. Rather, this discussion begins with the structure illustrated in FIG. 3. From there, another oxide layer 58 is formed on the top surface of additional layer 30, and then a second additional layer 60 is deposited on top of oxide layer 58, as shown in FIG. 7. The characteristics of, as well as the considerations pertaining to, oxide layer 58 and second additional layer 60 (and the ways in which they are formed) preferably are identical to, or at least substantially the same as, those of oxide layer 22 and additional layer 30, respectively, as discussed above. However, second additional layer 60 preferably is narrower (e.g., by at least 1 µm) than additional layer 30, at least in one direction, for allowing the top surface of layer 30 to be contacted (e.g., as described in greater detail below).

As shown, in the current embodiment, oxide layer 58 does not cover the entire top surface of additional layer 30, but rather a portion of such top surface is exposed for later attachment of an electrical contact. This configuration can be achieved by selectively oxidizing the top surface of additional layer 30, or by oxidizing the entire top surface and then subsequently etching away the desired portion.

Figure 8:
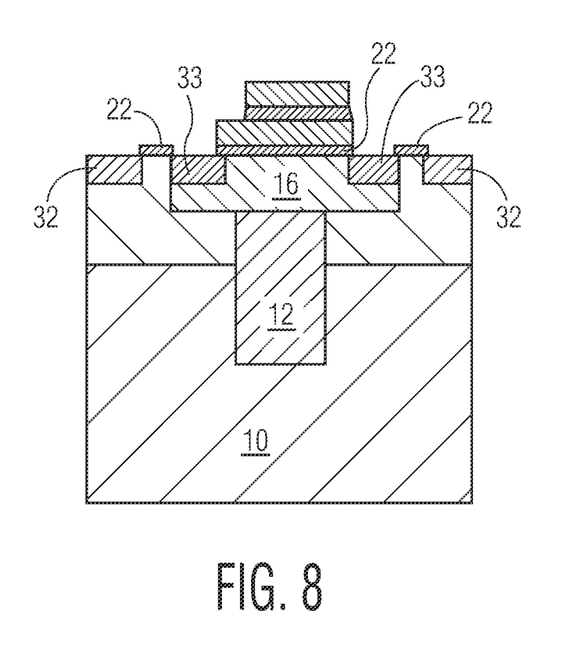
FIG. 8 is a conceptual diagram showing the structure of FIG. 7 after portions of the substrate oxide layer have been etched away, and the corresponding openings have been doped to provide anode and cathode regions.

Next, as shown in FIG. 8, portions of the oxide layer 22 are etched away, and the exposed areas of the semiconductor substrate 10 are further doped to create cathode regions 32 and anode regions 33, e.g., as described above in connection with FIG. 4.

Figure 9:
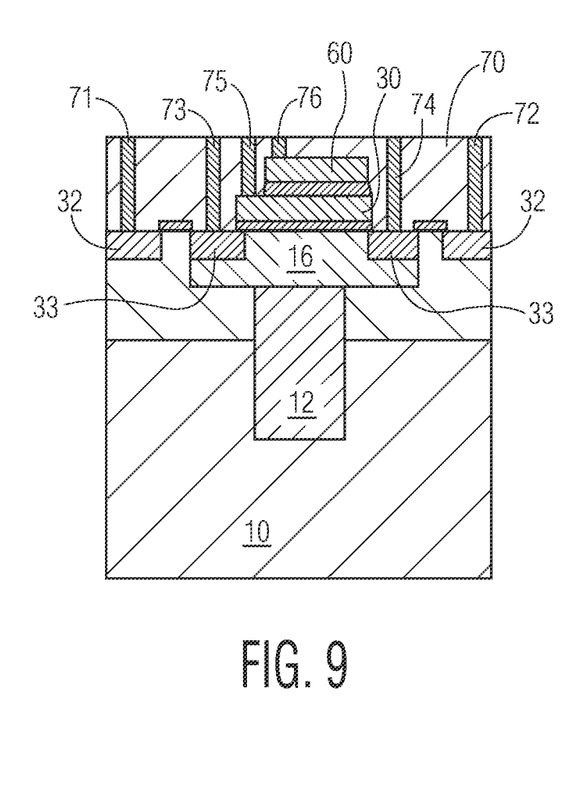
FIG. 9 is a conceptual diagram showing the structure of FIG. 8 after deposition of a first superstructure layer, etching of openings in such layer, and filling of such openings with metal to provide electrical contacts.
Figure 10:
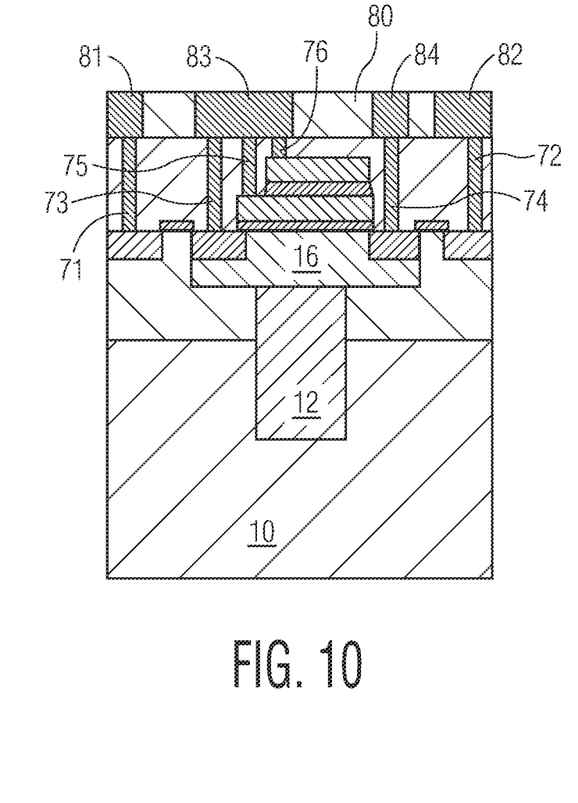
FIG. 10 is a conceptual diagram showing the structure of FIG. 9 after deposition of a second superstructure layer, etching of openings in such layer, and filling of such openings with metal to provide anode(s) and cathode(s) for connecting to the electronic device.

Finally, FIGS. 9 and 10 illustrate the application of a superstructure for establishing electrical connections to the resulting electronic device. Similar to the superstructure described in connection with FIGS. 5 and 6 above, the present superstructure primarily is comprised of TEOS, although other materials may be used in other embodiments. Initially, as shown in FIG. 9, a first layer 70 of TEOS is deposited. Openings are then etched into layer 70, and those openings are filled with metal (e.g., gold or copper), thereby forming electrical connections 71 and 72 to the cathode regions 32, electrical connections 73 and 74 to the anode regions 33 and electrical connections 75 and 76 to the additional layer 30 and the second additional layer 60, respectively. Thereafter, as shown in FIG. 10, a second layer 80 of TEOS is deposited, openings are etched into layer 80, and those openings are filled with metal so as to provide cathodes 81 and 82 from electrical connections 71 and 72, respectively, and anodes 83 and 84 from electrical connections 73 and 74, respectively. At the same time, anode 83 also electrically connects to electrical connections 75 and 76 (e.g., for the same reasons discussed above).

As will be readily appreciated, the resulting structure is similar to that shown in FIG. 6, with the exception that in this embodiment anode 83 is electrically connected to both additional layer 30 and second additional layer 60. Otherwise, the same features and considerations described above in connection with FIG. 6 preferably also pertain to the present structure.

Exemplary Devices.

Figure 11:
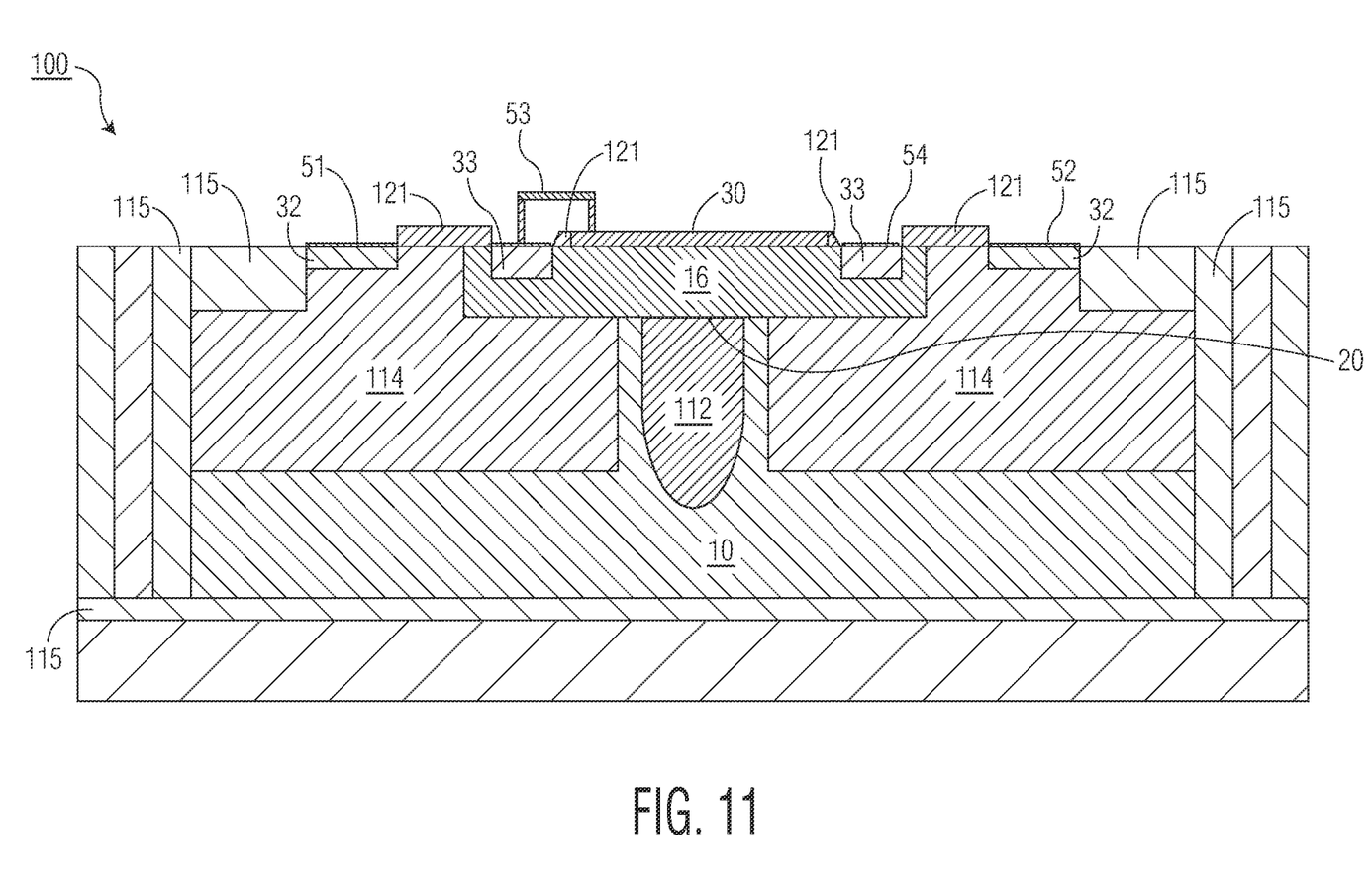
FIG. 11 is a simplified sectional view of a Zener diode having a single additional layer of substrate-compatible material deposited on the top surface of the device's substrate.

One example of a completed electronic device (in this case, a Zener diode 100) having a single additional layer 30 of substrate-compatible material (e.g., being the same material or having similar mechanical properties, such as polysilicon when the substrate 10 is made of silicon) deposited on the top surface of the substrate 10 is shown in FIG. 11. Relative to the features mentioned above in connection with FIGS. 1-6, Zener diode 100 reflects the following changes and additions. The heavily doped central N-type region 112 is shown as actually formed in the preferred embodiment (rather than the conceptual configuration of heavily doped central N-type region 12). The lightly doped N-type region 114 does not extend all the way to the heavily doped central N-type region 112 (as corresponding region 14 does to region 12), which currently is preferred. An enclosing box 115 separates the Zener diode 100 from other portions of the chip. Dielectric regions 121 (e.g., comprised of a combination of Oxide/Nitride (SiO2/SiN) layers) are provided to block shallow N+/P+ implants.

Figure 12:
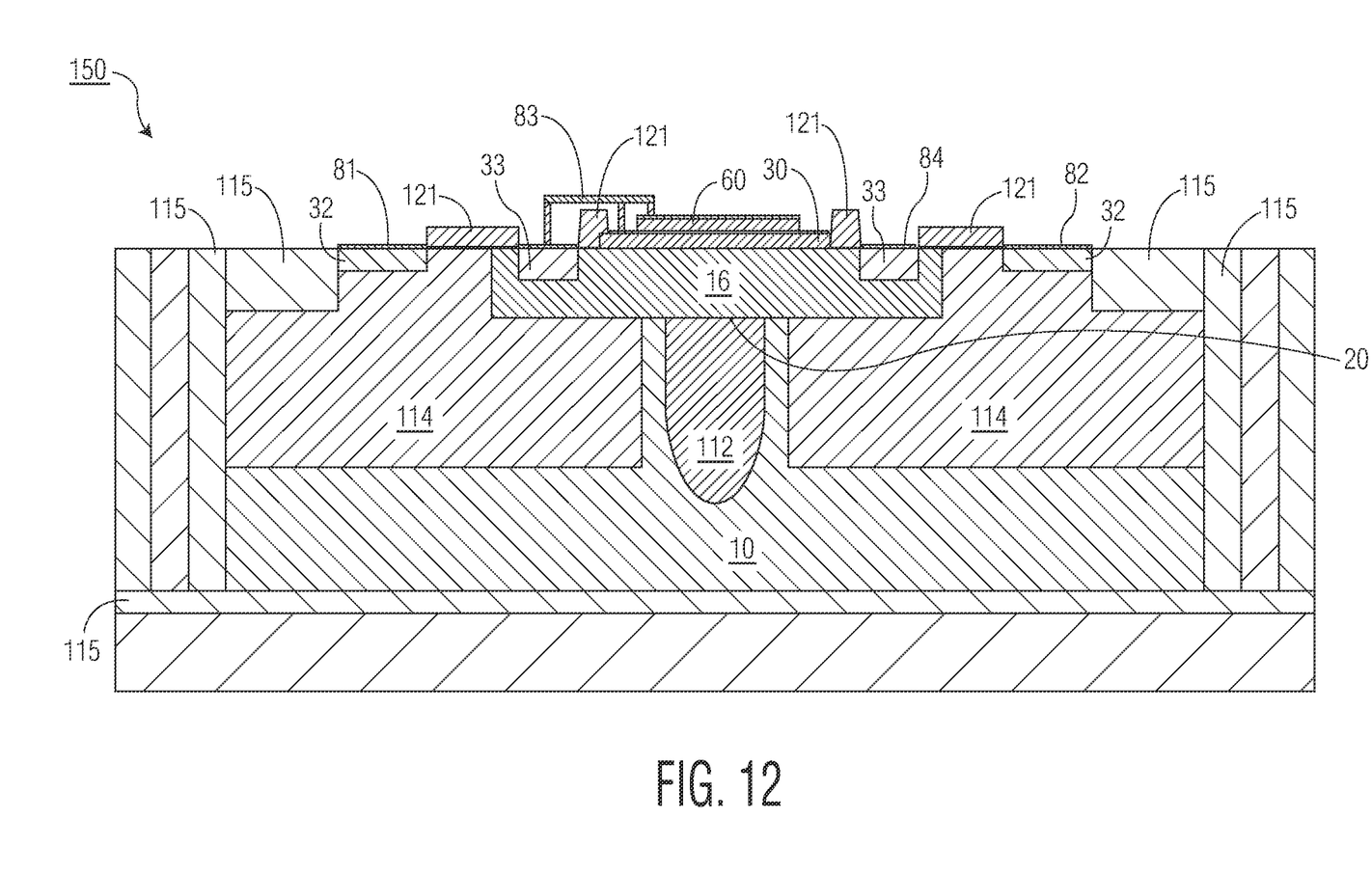
FIG. 12 is a simplified sectional view of a Zener diode having a stack of two additional layers of substrate-compatible material deposited on the top surface of the device's substrate.

An example of a completed electronic device (in this case, a Zener diode 150) having two additional layers 30 and 60 of substrate-compatible material deposited on the top surface of the substrate 10 is shown in FIG. 12. Relative to the features mentioned above in connection with FIGS. 1-3 and 7-11, Zener diode 150 reflects similar changes and additions as discussed above in connection with the Zener diode 100, and, generally speaking, the same comments regarding Zener diode 100 also apply to Zener diode 150.

Additional Considerations

While the foregoing discussion primarily pertains to Zener diodes, the same structures and processes also apply to other kinds of semiconductor devices, such as those intended to be operated as Zener diodes (e.g., using one junction of a bipolar junction transistor (BJT) as a Zener diode) or any other devices in which integrity of a junction is desired to be provided with additional protection from mechanical stresses. Therefore, any reference herein to a Zener diode can be replaced by a reference to any other semiconductor device, and the same considerations apply, e.g., with respect to any of the characteristics discussed herein and/or the placement, relative to each other, of: one or more additional layers, one or more insulating layers, and a junction that is intended to be protected.

The fabrication techniques that presently are used allow formation of an additional layer up to approximately 0.15 μm, which is the approximate thickness of each of layers 30 and 60 discussed above. Accordingly, additional thickness (which corresponds to additional protection for the junction from mechanical stresses) can be provided through the use of more of such additional layer(s), subject to any constraints, e.g., imposed by the device's packaging. In the current embodiments, in view of such constraints, the aggregate thickness of all such layers preferably is in the range of 0.1-0.3 μm.

Because the additional layers (e.g., 30 and, in the two-layer embodiment discussed above, 60) can be deposited after doping is completed, they themselves need not be doped, or if they are, such doping can be different than the doping in the regions underneath them.

In the embodiments discussed above, certain doping profiles are specified. It should be understood that these are exemplary only and that a variety of other doping profiles instead may be used, e.g., the opposite of what is described herein, with N-type regions replaced by P-type regions and vice versa.

As used herein, the term "attached", or any other form of the word, without further modification, is intended to mean directly attached, attached through one or more other intermediate elements or components, or integrally formed together. In the drawings and/or the discussion, where two individual components or elements are shown and/or discussed as being directly attached to each other, such attachments should be understood as being merely exemplary, and in alternate embodiments the attachment instead may include additional components or elements between such two components. Similarly, method steps discussed and/or claimed herein are not intended to be exclusive; rather, intermediate steps may be performed between any two steps expressly discussed or claimed herein.

Unless otherwise clearly stated herein, all relative directions (e.g., left, right, top, bottom, above, below) mentioned herein in relation to an article are from the perspective of the article itself and, therefore, are consistent across different views.

Whenever a specific value is mentioned herein, such a reference is intended to include that specific value or substantially or approximately that value. In this regard, the foregoing use of the word "substantially" is intended to encompass values that are not substantially different from the stated value, i.e., permitting deviations that would not have substantial impact within the identified context. For example, stating that a continuously variable signal level is set to a particular value should be understood to include values within a range around such specifically stated value that produce substantially the same effect as the specifically stated value. For example, the identification of a single length, width, depth, thickness, etc. should be understood to include values within a range around such specifically stated value that produce substantially the same effect as the specifically stated value. As used herein, except to the extent expressly and specifically stated otherwise, the term "approximately" can mean, e.g.: within ±10% of the stated value or within ±20% of the stated value.

In the event of any conflict or inconsistency between the disclosure explicitly set forth herein or in the accompanying drawings, on the one hand, and any materials incorporated by reference herein (whether explicitly or by operation of any applicable law, regulation or rule), on the other, the present disclosure shall take precedence. In the event of any conflict or inconsistency between the disclosures of any applications or patents incorporated by reference herein, the disclosure most recently added or changed shall take precedence.

Unless clearly indicated to the contrary, words such as "optimal", "optimize", "maximize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing or manufacturing constraints.

In the above discussion, certain processes and/or methods are explained by breaking them down into steps listed in a particular order. However, it should be noted that in each such case, except to the extent clearly indicated to the contrary or mandated by practical considerations (such as where the results from one step are necessary to perform another), the indicated order is not critical but, instead, that the described steps can be reordered and/or two or more of such steps can be performed concurrently.

As used herein, the words "include", "includes", "including", and all other forms of the word should not be understood as limiting, but rather any specific items following such words should be understood as being merely exemplary.

Several different embodiments of the present invention are described above and/or in any documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the intent and the scope of the invention. Accordingly, the invention is not limited to the precise embodiments shown in the drawings and described above. Rather, it is intended that all such variations not departing from the intent of the invention are to be considered as within the scope thereof, as limited solely by the claims appended hereto.

What is claimed is:

1. A semiconductor device, comprising:
   a silicon semiconductor substrate having a first doped region of a first doping type, and a second doped region of a second doping type,
   wherein the silicon semiconductor substrate physically expands or contracts in response to a temperature change;
   wherein the first doped region is beneath and immediately adjacent to in a first direction, the second doped region;
   wherein the first doped region and the second doped region form a P-N Zener diode junction region having a Zener breakdown voltage;
   wherein the Zener breakdown voltage drifts in response to the temperature change; and
   an additional polysilicon layer coupled above and covering the P-N Zener diode junction region,
   wherein the additional polysilicon layer physically expands or contracts in response to the temperature change substantially same as does the silicon semiconductor substrate,
   wherein in response to coupling of the additional polysilicon layer to the silicon semiconductor substrate, the Zener breakdown voltage drift is reduced in response to the temperature change;
   a second additional polysilicon layer that has been deposited above the additional polysilicon layer, wherein the additional polysilicon layer is wider in the second direction than the second additional polysilicon layer;
   wherein the second additional polysilicon layer also has similar mechanical properties as the silicon semiconductor substrate and covers at least 50% of the P-N Zener diode junction region;
   wherein a bottom surface of the second additional polysilicon layer is electrically insulated from a top surface of the additional polysilicon layer;
   a first electrical contact coupled to the first doped region;
   a second electrical contact coupled to the second doped region;
   a first electrical conductor electrically connecting the second electrical contact to the additional polysilicon layer; and
   a second electrical conductor electrically connecting the second electrical contact to the second additional polysilicon layer.

2. The semiconductor device according to claim 1,
   wherein the silicon semiconductor substrate has a first Young's modulus and the additional polysilicon layer has a second Young's modulus, and
   wherein the first Young's modulus, and the second Young's modulus are substantially same.

3. The semiconductor device according to claim 1,
   wherein the silicon semiconductor substrate is comprised of a first material and the additional polysilicon layer is comprised of a second material, and
   wherein the first material and the second material are at least 90% identical.

4. The semiconductor device according to claim 3, wherein the first material and the second material are at least 95% identical.

5. The semiconductor device according to claim 3, wherein the first material and the second material are at least 98% identical.

6. The semiconductor device according to claim 3, wherein each of the first material and the second material is comprised of at least 98% silicon.

7. The semiconductor device according to claim 1, wherein the additional polysilicon layer covers at least 80% of the P-N Zener diode junction region.

8. The semiconductor device according to claim 1, wherein the additional polysilicon layer covers all of the P-N Zener diode junction region.

9. The semiconductor device according to claim 1, wherein an entire bottom surface of the additional polysilicon layer is electrically insulated from an entire top surface of the second doped region.

10. The semiconductor device according to claim 1,
    wherein the silicon semiconductor substrate has a top surface onto which an oxide layer has been formed, and
    wherein the oxide layer is disposed between a bottom surface of the additional polysilicon layer and a top surface of the second doped region.

11. The semiconductor device according to claim 1, wherein the additional polysilicon layer is at least 0.1 micron thick.

12. The semiconductor device according to claim 1, wherein both the first doped region and the second doped region are heavily doped.

13. The semiconductor device according to claim 1, wherein the first doping type is N-type, and the second doping type is P-type.

14. The semiconductor device according to claim 1, wherein
    the second doped region is wider in a second direction than the additional polysilicon layer, wherein the second direction is substantially perpendicular to the first direction, and
    the additional polysilicon layer is wider in the second direction than the second additional polysilicon layer.

* * * * *